United States Patent
Ando et al.

(10) Patent No.: US 8,309,922 B2
(45) Date of Patent: Nov. 13, 2012

(54) SEMICONDUCTOR INSPECTION METHOD AND DEVICE THAT CONSIDER THE EFFECTS OF ELECTRON BEAMS

(75) Inventors: Tohru Ando, Tokyo (JP); Masahiro Sasajima, Hitachinaka (JP)

(73) Assignee: Hitachi High Technologies Corporation, Tokyo (JP)

( * ) Notice: Subject to any disclaimer, the term of this patent is extended or adjusted under 35 U.S.C. 154(b) by 0 days.

(21) Appl. No.: 13/148,205

(22) PCT Filed: Jan. 20, 2010

(86) PCT No.: PCT/JP2010/000281
§ 371 (c)(1),
(2), (4) Date: Aug. 5, 2011

(87) PCT Pub. No.: WO2010/089960
PCT Pub. Date: Aug. 12, 2010

(65) Prior Publication Data
US 2011/0291009 A1   Dec. 1, 2011

(30) Foreign Application Priority Data
Feb. 6, 2009 (JP) .................................. 2009-025496

(51) Int. Cl.
*H01J 37/28* (2006.01)
*G01N 23/00* (2006.01)
(52) U.S. Cl. ........ 250/310; 250/311; 250/306; 250/307; 250/396 R; 250/397
(58) Field of Classification Search .................. 250/310, 250/311, 306, 307, 396 R, 397
See application file for complete search history.

(56) References Cited

U.S. PATENT DOCUMENTS

| | | | | |
|---|---|---|---|---|
| 7,087,899 | B2 * | 8/2006 | Ezumi et al. | 250/311 |
| 7,700,918 | B2 * | 4/2010 | Ezumi et al. | 250/310 |
| 7,989,766 | B2 * | 8/2011 | Nara et al. | 250/306 |
| 2005/0140379 | A1 | 6/2005 | Furukawa et al. | |
| 2006/0192574 | A1 | 8/2006 | Furukawa et al. | |
| 2008/0068033 | A1 | 3/2008 | Kagami | |
| 2008/0218185 | A1 | 9/2008 | Furukawa et al. | |

FOREIGN PATENT DOCUMENTS

| | | |
|---|---|---|
| JP | 2002-343843 | 11/2002 |
| JP | 2004-158366 | 6/2004 |
| JP | 2005-210067 | 8/2005 |
| JP | 2008-078227 | 4/2008 |

* cited by examiner

*Primary Examiner* — Nikita Wells
(74) *Attorney, Agent, or Firm* — McDermott Will & Emery LLP

(57) ABSTRACT

Disclosed is a device capable of probing with minimal effect from electron beams. Rough probing is made possible using a lower magnification than the magnification usually viewed. When target contact of semiconductor is detected, measurement position is set in the center of picture usually to move probe without moving stage. With the miniaturization, contact can be confirmed only at high magnification, although probe can be confirmed at low magnification on the contrary but it is necessary to display it in real time. Static image obtained at high magnification once is combined with image obtained at low magnification in real time from target contact required for probing and characteristic of probe to be displayed, so that probing at low magnification can be realized to reduce the effects of electron beams and obtain accurate electrical characteristics.

10 Claims, 4 Drawing Sheets

101···PRIMARY ELECTRON BEAMS 102···SECONDARY ELECTRON BEAMS 103···SAMPLE
104···SECONDARY ELECTRON DETECTOR 105···VACUUM CHAMBER PARTITION WALL
111···ELECTRON GUN 112···CONDENSING LENS 113···CONDENSING LENS 114···DIAPHRAGM
115···SCAN DEFLECTOR 116···IMAGE SHIFT DEFLECTOR 117···OBJECTIVE LENS
118···ELECTRON BEAM IRRADIATION OPTICAL SYSTEM 121···BASE 122···LARGE STAGE
123···SAMPLE STAND DRIVING MEANS 124···SAMPLE STAND 125···PROBE DRIVING MEANS
126···PROBE ATTACHMENT 127···PROBE 131···FIRST IMAGE PROCESSING SYSTEM
132···MEMORY MEANS 133···DISPLAY UNIT 134···CONTROL COMPUTER

FIG. 1

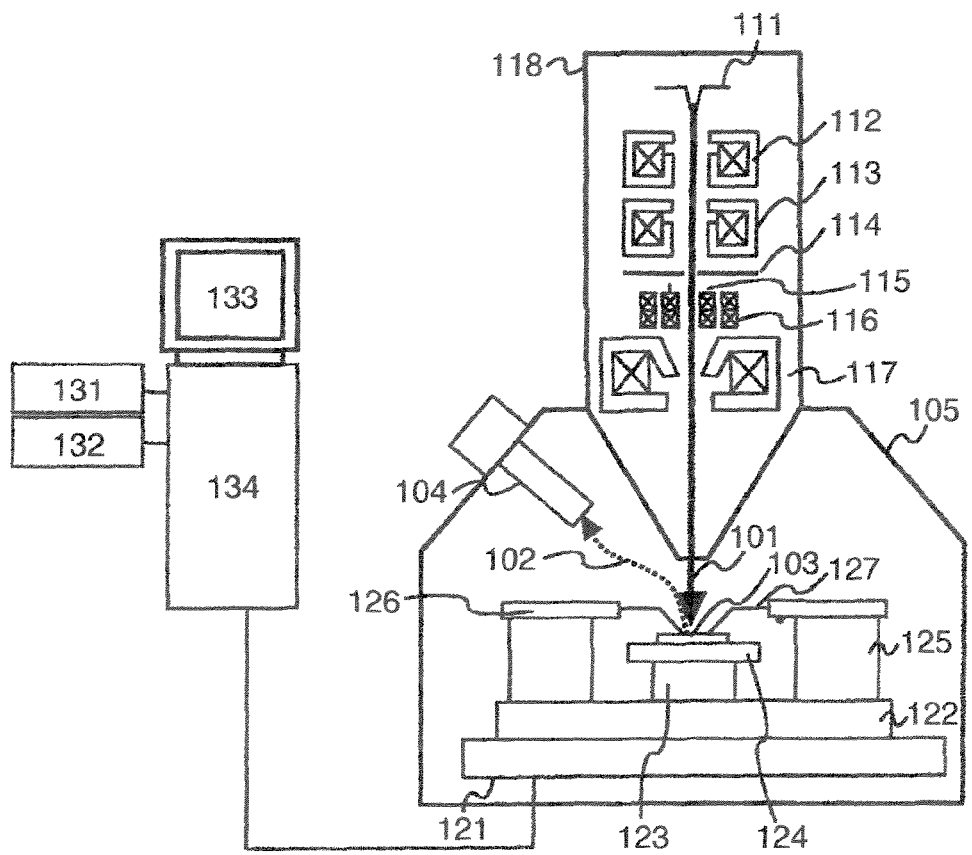

101···PRIMARY ELECTRON BEAMS 102···SECONDARY ELECTRON BEAMS 103···SAMPLE
104···SECONDARY ELECTRON DETECTOR 105···VACUUM CHAMBER PARTITION WALL
111···ELECTRON GUN 112···CONDENSING LENS 113···CONDENSING LENS 114···DIAPHRAGM
115···SCAN DEFLECTOR 116···IMAGE SHIFT DEFLECTOR 117···OBJECTIVE LENS
118···ELECTRON BEAM IRRADIATION OPTICAL SYSTEM 121···BASE 122···LARGE STAGE
123···SAMPLE STAND DRIVING MEANS 124···SAMPLE STAND 125···PROBE DRIVING MEANS
126···PROBE ATTACHMENT 127···PROBE 131···FIRST IMAGE PROCESSING SYSTEM
132···MEMORY MEANS 133···DISPLAY UNIT 134···CONTROL COMPUTER

201···PRIMARY ELECTRON BEAMS 202···SAMPLE 20···SUBSTRATE 204···OXIDE LAYER
205···DRAIN 206···SOURCE 207···GATE 208···CONTACT 209···ELECTRON BEAM INVASION AREA

301···HIGH-MAGNIFICATION PICTURE 302···TARGET CONTACT 303···PROBE

401···LOW-MAGNIFICATION PICTURE  402···TARGET CONTACT  403,404···PROBE

501···LOW-MAGNIFICATION REFERENCE PICTURE  502···TARGET CONTACT
503,505···PROBE  504···HIGH-MAGNIFICATION ORIGINAL PICTURE AREA

601···HIGH-MAGNIFICATION REFERENCE PICTURE  602···TARGET CONTACT  603,604···PROBE

FIG. 7

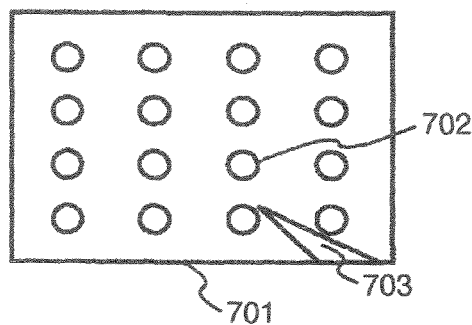

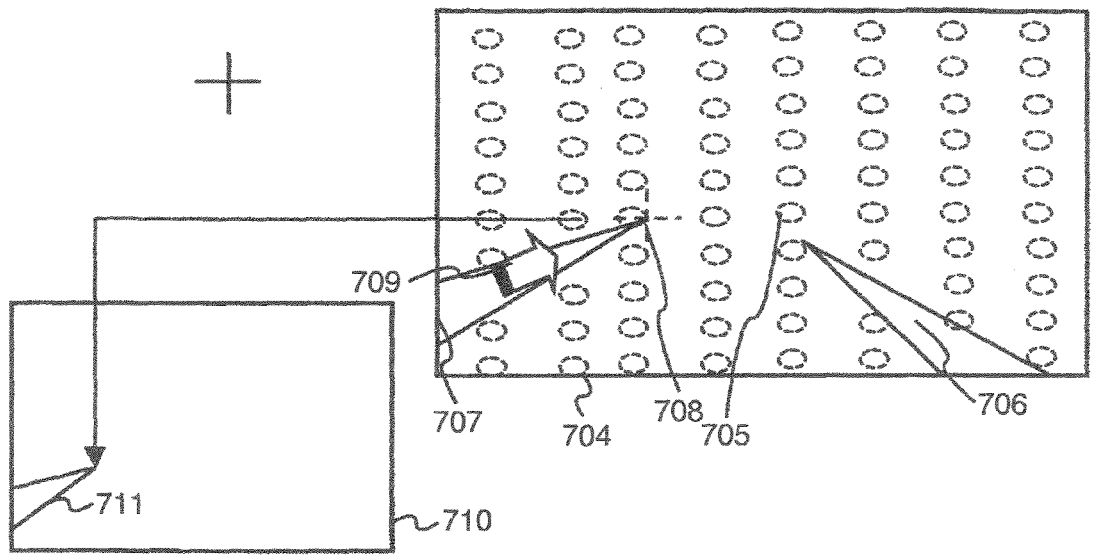

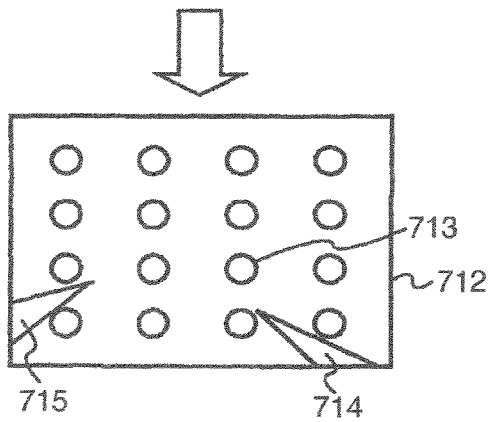

701···HIGH-MAGNIFICATION PICTURE 702···TARGET CONTACT 703,706,707···PROBE
704···LOW-MAGNIFICATION PICTURE 705···TARGET CONTACT 708···TIP POSITION OF PROBE
709···PROBE MOVEMENT DIRECTION
710···HIGH-MAGNIFICATION PICTURE CALCULATED AT LOW MAGNIFICATION
711···CALCULATED PROBE 712···HIGH-MAGNIFICATION PICTURE COMBINED
713···TARGET CONTACT COMBINED 714···PROBE COMBINED
715···PROBE COMBINED AFTER CALCULATION OF MOVEMENT

SEMICONDUCTOR INSPECTION METHOD AND DEVICE THAT CONSIDER THE EFFECTS OF ELECTRON BEAMS

RELATED APPLICATIONS

This application is the U.S. National Phase under 35 U.S.C. §371 of International Application No. PCT/JP2010/000281, filed on Jan. 20, 2010, which in turn claims the benefit of Japanese Application No. 2009-025496, filed on Feb. 6, 2009, the disclosures of which Applications are incorporated by reference herein.

TECHNICAL FIELD

The present invention relates to a semiconductor inspection device and method and more particularly to a semiconductor inspection method and device that perform inspection or defect analysis to get electrical characteristics of semiconductor while reducing damage caused to semiconductor by electron beams of a scanning electron microscope (SEM).

BACKGROUND ART

In recent years, miniaturization of 45-nm devices and semiconductors are advanced, so that distance and height between contacts of transistor become very short. Accordingly, when semiconductor is inspected by the device as described in Patent Literature 1, it is getting difficult to get accurate transistor characteristics because of effects of electron beams absorbed by semiconductor.

Accordingly, in the pre-processing of semiconductor, oxide layer is left as large as possible so as to make the oxide layer thicker, so that semiconductor is processed to escape from the effects of electron beams even a little. Further, acceleration voltage of electron beams and emission current are reduced to thereby decrease the effects of electron beams although there is obtained an image having low contrast and difficult to understand.

CITATION LIST

Patent Literature

Patent Literature 1: JP-A-2002-343843

SUMMARY OF INVENTION

Technical Problem

However, with the miniaturization, invasion area affects contacts, oxide layer, gate, source and drain due to influence of electrification of electron beams, so that electrical characteristics cannot be obtained accurately (refer to FIG. 2). In order to get electrical characteristics accurately, it is necessary to probe contacts accurately while observing the contacts in SEM image at high magnification in detail, although this causes large damage to sample and there is a trade-off relationship therebetween.

When accurate electrical characteristics cannot be obtained, it is not understood which characteristic is defective when some electrical characteristics of transistor are obtained and one defect is found and accordingly there arises a problem. Further, there is a possibility that absolutely accurate electrical characteristics cannot be obtained even if relative electrical characteristics can be obtained.

Moreover, the fact that the effects of electron beams are reduced requires some restriction on observation of contact. If a probe is not put on correct contact, accurate electrical characteristics cannot be measured naturally. An apparatus requiring probing is described in Patent Literature 1.

With the miniaturization, when contact at the tip of probe is to be viewed without using a scanning electron microscope having the magnification of twenty to thirty thousands, the presence of the contact cannot be viewed and naturally it cannot be probed. Further, in order to reduce the effects of electron beams, acceleration voltage is reduced to 0.5 kV and emission current is reduced to 5 µA. Clear SEM image cannot be obtained and in the existing circumstances probing is made in the state that contact is viewed dimly. Moreover, since electric charges of electron beams are easily accumulated when scanning mode of electron beams is slow, TV mode (about 20 msec. per picture) is utilized as much as possible.

It is an object of the present invention to reduce the effects of electron beams and get accurate electrical characteristics so that defective position is made clear. Furthermore, it is an object of the present invention to view contact sufficiently and put a probe on contact sufficiently even if electron beams are restricted.

Solution to Problem

As measures for solving the above problem, a stage is fixed and a contact to be probed is decided. Then, an image of the contact is obtained at high magnification once. Further, a probe is displayed in real time at low magnification so as to show where the probe is. The contact image obtained at high magnification once is combined with the probe image expressed in real time at low magnification and the combined image is expressed.

If the tip position of the probe is understood from low-magnification image, where the tip position of the probe exists in high-magnification image can be calculated. The probe position calculated from low-magnification image is expressed in real time in high-magnification image obtained once, so that damage to sample can be reduced.

When the effects of electron beams are analyzed from many different angles, sample is damaged upon probing requiring handling extremely. Further, contact of sample cannot be viewed unless magnification of tens of thousands is used, although it is not necessary to move stage during probing. Moreover, since probe is large, it can be viewed from several times, although the probe collides with adjacent probe unless it is viewed in real time upon probing, so that probe is damaged.

A stage is fixed and a contact to be probed is decided. Then, an image of the contact is obtained at high magnification once. Further, a probe is displayed in real time at low magnification so as to show where the probe is. In brief, a combined image of the contact image obtained at high magnification once with the probe image expressed in real time at low magnification is expressed, so that both of static contact and dynamic contact can be expressed and sample is not damaged since processing can be made at low magnification usually.

Advantageous Effects of Invention

According to the present invention, since defective position can be probed rapidly and accurately and furthermore the effects of electron beams can be suppressed slightly, measurement of electrical characteristics and the like of semiconductor and realization of a semiconductor inspection device can be attained and user's usefulness is improved.

BRIEF DESCRIPTION OF DRAWINGS

FIG. 1 is a schematic diagram illustrating a semiconductor inspection device;

FIG. 7 is a diagram illustrating an embodiment of the present invention.

DESCRIPTION OF EMBODIMENTS

Figure 2:
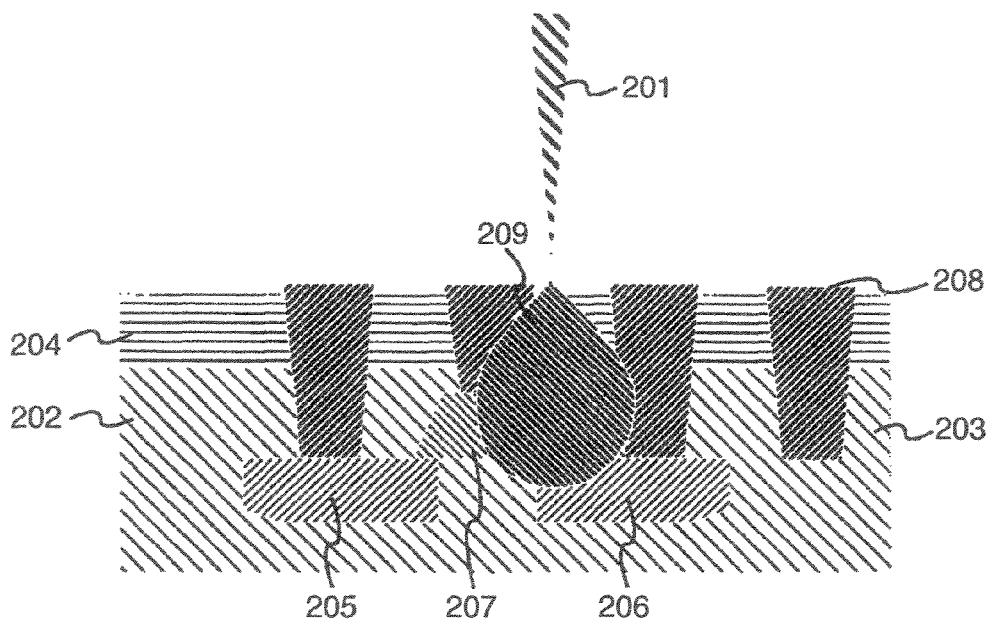
FIG. 2 is a diagram showing the effects of electron beams on transistor in semiconductor.
Figure 3:
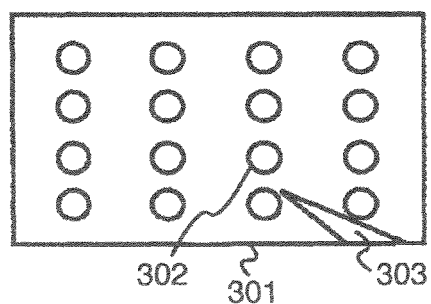
FIG. 3 is a diagram illustrating an embodiment of the present invention.

An embodiment of the present invention is now described with reference to the accompanying drawings.

FIG. 1 is a schematic diagram illustrating a semiconductor inspection device to which an embodiment of the present invention is applied.

In FIG. 1, the semiconductor inspection device irradiates a thin sample 103 in a vacuum chamber partition wall 105 with primary electron beams 101 of an SEM (scanning electron microscope). Second electron beams 102 are detected by a secondary electron detector 104 and an SEM image of semiconductor is displayed in a display unit 133 through by means of a control computer 134. This SEM image is utilized when a probe 127 is put on the sample 103.

The control computer 134 utilizes a first image processing system 131, a memory means 132 and the display unit 133 to perform operation control of the whole semiconductor inspection device such as SEM image, movement of stage, change of magnification and the like.

An electron beam irradiation optical system 118 generates primary electron beams 101 from an electron gun 111 through condensing lenses 112, 113, diaphragm 114, scan deflector 115, image shift deflector 116 and objective lens 117. Sometimes, only one condensing lens is provided. The scan deflector 115 decides direction and magnification of scan.

In stage, large stage 122, sample stand driving means 123, sample stand 124, probe driving means 125, probe attachment 136 and probe 127 are mounted on base 121.

The present invention can be implemented by SEM which can change magnification and edit image basically.

FIG. 2 shows the effects of electron beams on transistor in general semiconductor. Sample 202 is irradiated with primary electron beams 201. The sample is polished and upper layer part thereof is scraped. Oxide layer 204 is formed on substrate 203 and drain 205, source 206 and gate 207 constituting transistor are connected to contacts 208. Probe is put on contact part and electrical characteristics of transistor is obtained to thereby understand which transistor is defective.

However, when sample is irradiated with primary electron beams, electron beam invasion area 209 can be formed to a large or small extent. When the electron beam invasion area 209 extends to drain 205, source 206 and gate 207, important electrical characteristics is affected, so that it cannot be understood which transistor is defective. For example, rising of Vth characteristic indicating voltage with which drain current flows suddenly when gate voltage exceeds a certain value is affected. With the miniaturization in recent years, distance between contacts is shorter and thickness of oxide layer is thinner gradually, so that electrical characteristics are apt to be affected by thinner oxide layer even if electron beam invasion area is the same.

In order to make the electron beam invasion area 209 as small as possible and not to extend the electron beam invasion area 209 to drain 205, source 206 and gate 207, it is considered that acceleration voltage (1.0 kV or less) of primary electron beams 201 is reduced and emission current (5 μA or less) of primary electron beams 201 is reduced. Furthermore, there are countermeasures that observation is made at as low magnification as possible, focusing of electron beams on sample is reduced to the lowest minimum, fast scanning mode is used to make it difficult to accumulate electric charges, observation is made within as short a time as possible and so on.

However, any of them is unnecessary item for probing and when probing is made in clear SEM image, damage to sample is increased. There is a tradeoff relationship between probing and low damage.

Accordingly, 2 kinds of images of high and low magnifications are used to solve probing and low damage. Referring now to FIGS. 3 to 7, description is made. When a plurality of probes 303 are now to be concentrated on target contact 302 in the state that target contact 302 and probes 303 are displayed in picture 301 of high magnification, image in picture 301 of high magnification is obtained once.

Next, the picture is changed to picture 401 of low magnification. At this time, it is effective that focusing is changed from sample to probe. When magnification is changed to be low, probe 404 distant from the center can be viewed but the whole contact cannot be sometimes viewed. Moreover, position of target contact 402 is not clear also.

Figure 5:
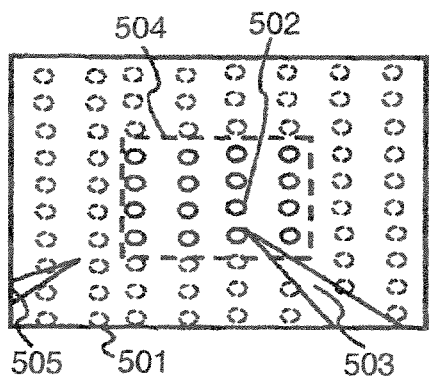
FIG. 5 is a diagram illustrating an embodiment of the present invention.

Accordingly, as shown in FIG. 5, data is reduced to display high-magnification picture 301 within high-magnification original picture area 504 in the center of low-magnification picture 401.

That is, target contact 502 and probes 503 and 505 are displayed within low-magnification reference picture 501 and image only in high-magnification original picture area 504 is easier to understand. It is a matter of course that since this image is obtained at high magnification only once and thereafter obtained at low magnification, damage is reduced. Magnification is changed to thereby change size of the high-magnification original picture area 504, so that image can be obtained at lower magnification than magnification of high-magnification original picture. Consequently, since magnification can be changed to be low to position that probe can be viewed and high-magnification original picture area can be interlocked with magnification changed while probing where target contact 502 is, operation can be made easily.

Further, when focusing is made on probe instead of sample, electron beams are not focused or concentrated on sample because of difference in height between probe and sample and accordingly damage to sample can be reduced. Since only probe information is required in low-magnification picture, information of clearer probe can be obtained and this is a bright idea that makes it possible to kill two birds with one stone. In editing of image within high-magnification original picture area 504 of FIG. 5, integration can be made to judge both of low-magnification probe and high-magnification target contact 502.

Figure 6:
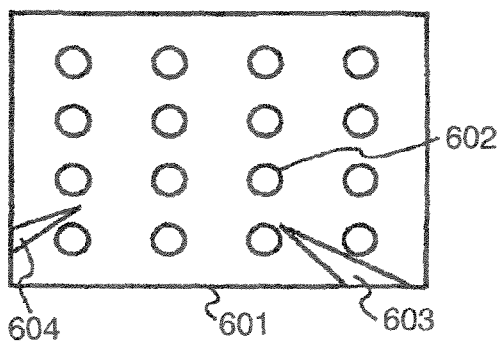
FIG. 6 is a diagram illustrating an embodiment of the present invention.

Next, as shown in FIG. 6, high-magnification picture is displayed as a base notwithstanding that processing is being made at low magnification and low-magnification image data is displayed in the high-magnification picture on an enlarged scale in a superposition manner. Probe 604 displayed newly is obtained by enlarging low-magnification image. The image is slightly rough, although position of probe can be understood clearly.

Further, even if probe 303 displayed originally in high-magnification picture 301 is moved, probe 303 is displayed in original image and accordingly both of probe 303 at original position and newly moved probes 303 and 403 are displayed. However, it can be easily imagined that probe distant from center is probe of previous original image and accordingly there is no problem.

When probing is made, it is considered that it is meaningless to make probing in accurate image and it is effective that measured result of electrical characteristics after probing is accurate.

Figure 4:
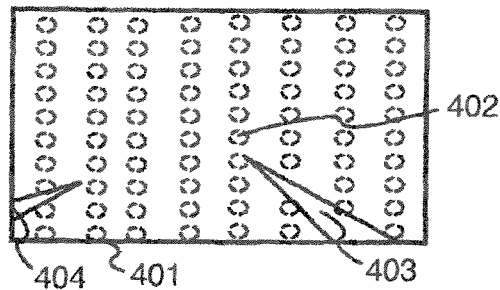
FIG. 4 is a diagram illustrating an embodiment of the present invention.

Moreover, as another method of FIG. 6, picture obtained in real time at low magnification in FIG. 4 is searched for the tip of probe by means of image processing and where its position is in high-magnification picture 301 is calculated to display probe 604. This method is illustrated in FIG. 7.

A picture 701 of high magnification is obtained once. Target contact 702 and probe 703 are contained in high-magnification picture 701.

Next, the picture is changed to picture 704 of low magnification. Target contact 702 of high magnification corresponds to target contact 705 of low magnification and probe 703 of high magnification corresponds to probe 706 of low magnification.

At this time, image can be displayed at high magnification by changing picture by user, although actual electron beam irradiation optical system is left to be low magnification as it is. When probe 707 is moved in movement direction 709 by user's operation, the device understands that probe considered beforehand to be moved is moved and accordingly the tip position 708 of probe is detected from low-magnification image. Where the tip position 708 in low-magnification picture 704 is in high-magnification picture 710 is calculated to be displayed. High-magnification picture 701 is combined with high-magnification picture 710 in which the tip position of probe is detected to display picture 712 to user.

Target contact 713 and probes 714 and 715 are displayed, so that user can view image as if high-magnification picture is handled notwithstanding that sample is irradiated at low magnification.

At that time, there are 3 display methods of probe 715.

In the first method, images of probes prepared beforehand as system are superposed.

In the second method, images cut out from high-magnification picture are combined.

In the third method, marker indicating picture or drawing of probe is displayed at tip position. This method is also effective. In case of superposition of images, in order to improve quality of image, when low magnification is set to divisor of high magnification, expansion/reduction result of image is satisfactory and image is not distorted.

Since image is not expanded and reduced when marker is displayed, influence due to difference of magnification between high magnification and low magnification is reduced.

In the foregoing description, for simplification of description, operation at the time that single probe is moved has been described, although even if a plurality of probes are moved, the same way of thinking can be used to cope with it.

When marker is displayed, expression of thickness of probe at high magnification is apt to be unclear and accordingly breakage of probe due to contact or collision between probes is considered. However, picture or drawing of marker is expressed by 2 lines extending from tip of probe as shown by 403 and lines of probe having sufficiently safe thickness are drawn, so that contact can be avoided.

High-magnification picture 301 of original image and low-magnification picture 401 are subjected to image editing such as contrast emphasis, color display and outline emphasis, so that difference between current data and past data is clear. Further, when image editing of high-magnification picture 301 is performed once, it is not necessary to perform the image editing upon combination of low-magnification picture with high-magnification picture in real time. Accordingly, processing time is not required and contact can be emphasized. It is possible to perform editing in which probe in past position is not emphasized, so that difference between the probe in past position and latest probe expressed in low-magnification picture 401 can be expressed effectively.

The system of FIG. 5 is used in early stage of rough probing so that operation can be made while confirming distant probe and when probes are collected to some extent, the system of FIG. 6 can be used to approach probe to appropriate position. In this manner, the system can be used in accordance with convenient case, so that probing can be made without damaging sample.

REFERENCE SIGNS LIST 101 primary electron beams
102 secondary electron beams
103, 202 sample
104 secondary electron detector
105 vacuum chamber partition wall
110, 118 electron beam irradiation optical system
111 electron gun
112 condensing lens 1
113 condensing lens 2
114 diaphragm
115 scan deflector
116 image shift deflector
117 objective lens
121 base
122 large stage
123 sample stand driving means
124 sample stand
125 probe driving means
126 probe attachment
127, 303, 403, 404, 503, 505, 603, 604, 703, 706, 707 probe
128 electrical characteristic measuring instrument
131 first image processing system
132 memory means
133 display unit
134 control computer
201 primary electron beams
203 substrate
204 oxide layer
205 drain
206 source
207 gate
208 contact
209 electron beam invasion area
301, 701 high-magnification picture
302, 402, 502, 602, 702, 705 target contact
401, 704 low-magnification picture
501 low-magnification reference picture
504 high-magnification original picture area
601 high-magnification reference picture
708 tip position of probe 709 probe movement direction
710 high-magnification picture calculated at low magnification
711 calculated probe
712 high-magnification picture combined
713 target contact combined
714 probe combined
715 probe combined after calculation of movement

The invention claimed is:

1. A semiconductor inspection device comprising:
a sample stand on which a sample can be put;
an electron beam irradiation optical system capable of irradiating with electron beams;
a deflecting coil capable of changing magnification;
a detector capable of detecting secondary electrons generated from the sample;
a display unit to display a sample image obtained on the basis of signal from the detector; and
one or more probes capable of coming in contact with the sample;
wherein
when the probe is put on the sample, a static image of the sample of high magnification magnified by the deflecting coil and a real-time image of the probe operating at low magnification are combined to be displayed in the display unit.

2. A semiconductor inspection device according to claim 1, wherein
static image of high magnification is obtained once and static image of low magnification is obtained to show the probe, the static image of low magnification being edited to be combined with the static image of high magnification repeatedly.

3. A semiconductor inspection device according to claim 1, wherein
static image of high magnification is obtained once and only an image of the probe is cut out, tip of the probe being detected from low-magnification image, the image of the probe cut out being moved to detected position to thereby move the probe.

4. A semiconductor inspection device according to claim 3, wherein image obtained beforehand by only tip detection of the probe or marker is expressed as a moving probe.

5. A semiconductor inspection device according to claim 1, wherein
static images of high magnification and low magnification are subjected to image editing processing including color display and outline emphasis to be made easy to understand.

6. A semiconductor inspection method implemented on a device including: a sample stand on which a sample can be put; an electron beam irradiation optical system capable of irradiating with electron beams; a deflecting coil capable of changing magnification; a detector capable of detecting secondary electrons generated from the sample; and one or more probes capable of coming in contact with the sample; the method including:
when the probe is put on the sample, combining a static image of the sample of high magnification magnified by the deflecting coil and an image of the probe operating at low magnification in real time.

7. A semiconductor inspection method according to claim 6, wherein
static image of high magnification is obtained once and static image of low magnification is obtained to show the probe, the static image of low magnification being edited to be combined with the static image of high magnification repeatedly.

8. A semiconductor inspection method according to claim 6, wherein
static image of high magnification is obtained once and only the image of the probe is cut out, tip of the probe being detected from low-magnification image, the image of the probe cut out being moved to detected position to thereby move the probe.

9. A semiconductor inspection method according to claim 8, wherein
image obtained beforehand by only tip detection of the probe or marker is expressed as a moving probe.

10. A semiconductor inspection method according to claim 6, wherein
static images of high magnification and low magnification are subjected to image editing processing including color display and outline emphasis to be made easy to understand.

* * * * *